United States Patent
Lalbahadoersing et al.

(10) Patent No.: US 7,355,675 B2
(45) Date of Patent: Apr. 8, 2008

(54) METHOD FOR MEASURING INFORMATION ABOUT A SUBSTRATE, AND A SUBSTRATE FOR USE IN A LITHOGRAPHIC APPARATUS

(75) Inventors: Sanjay Lalbahadoersing, Helmond (NL); Marco Johannes Annemarie Pieters, Eindhoven (NL); Jan Hauschild, Eindhoven (NL); Coen Van De Vin, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 214 days.

(21) Appl. No.: 11/135,630

(22) Filed: May 24, 2005

(65) Prior Publication Data
US 2006/0138410 A1    Jun. 29, 2006

Related U.S. Application Data

(60) Provisional application No. 60/639,847, filed on Dec. 29, 2004.

(51) Int. Cl.
G03B 27/42    (2006.01)

(52) U.S. Cl. .................. 355/53; 356/399; 356/401

(58) Field of Classification Search .......... 355/18, 355/40, 53–54; 101/485–486, 481, DIG. 36; 257/48, 797; 430/22, 30; 356/399–401
See application file for complete search history.

(56) References Cited

U.S. PATENT DOCUMENTS

| | | | |
|---|---|---|---|
| 4,356,392 A | 10/1982 | Wittekoek et al. | |
| 4,778,275 A | 10/1988 | Van den Brink et al. | |
| 5,144,363 A | 9/1992 | Wittekoek et al. | |
| 5,633,698 A * | 5/1997 | Imai | 355/72 |
| 5,960,107 A * | 9/1999 | Leroux | 382/145 |
| 5,969,428 A * | 10/1999 | Nomura et al. | 257/797 |
| 5,969,441 A | 10/1999 | Loopstra et al. | |
| 5,985,764 A | 11/1999 | Lin et al. | |
| 6,133,641 A | 10/2000 | Hamada et al. | 257/797 |
| 6,157,087 A | 12/2000 | Zhao et al. | 257/797 |
| 6,262,796 B1 | 7/2001 | Loopstra et al. | |
| 6,297,876 B1 | 10/2001 | Bornebroek | |

(Continued)

FOREIGN PATENT DOCUMENTS

DE    102 59 322 A1    7/2004

(Continued)

OTHER PUBLICATIONS

European Search Report issued for European Patent Application No. 05258013.1-2222, dated Jun. 28, 2006.

(Continued)

*Primary Examiner*—D. Rutledge
(74) *Attorney, Agent, or Firm*—Pillsbury Winthrop Shaw Pittman LLP

(57) ABSTRACT

A method for measuring information provided by a substrate. The substrate includes a feature that has been created by a lithographic apparatus. The method includes projecting a beam of light onto a marker disposed above and/or near the feature on the substrate, and detecting information provided by the marker with a sensor. A coating is disposed on the substrate so that the coating lies between the beam of light and the feature to substantially prevent the beam of light from being reflected by the feature and causing an inaccurate readout of the information provided by the marker.

64 Claims, 4 Drawing Sheets

U.S. PATENT DOCUMENTS

| | | |
|---|---|---|
| 6,452,284 B1 * | 9/2002 | Sheck .................... 257/797 |
| 6,710,849 B2 | 3/2004 | Kwan et al. |
| 6,774,452 B1 * | 8/2004 | Ramkumar et al. ......... 257/506 |
| 6,815,838 B2 * | 11/2004 | Daubenspeck et al. ..... 257/797 |
| 2003/0096496 A1 * | 5/2003 | Huang et al. ............... 438/633 |
| 2003/0157416 A1 * | 8/2003 | Mizutani et al. ............. 430/5 |
| 2004/0016396 A1 * | 1/2004 | Nagai et al. ................. 117/84 |
| 2004/0043310 A1 | 3/2004 | Takeishi et al. ............. 430/22 |
| 2004/0075179 A1 | 4/2004 | Liu et al. .................... 257/797 |
| 2004/0261282 A1 * | 12/2004 | Bae et al. .................... 33/645 |
| 2007/0164117 A1 * | 7/2007 | Swiler et al. ............... 235/491 |

FOREIGN PATENT DOCUMENTS

| | | |
|---|---|---|
| JP | 59-220604 | 12/1984 |
| JP | 61-248427 | 11/1986 |
| JP | 2-36523 | 2/1990 |
| JP | 2-229419 | 9/1990 |
| JP | 5-198471 | 8/1993 |

OTHER PUBLICATIONS

Klaus Eberhardt, Advanced Photoresist Wafer Processing System for Deep UV (DUV), http://www.semiconducttorfabtech.com/features/lithography/articles/body6.225.php3, p. 10 pages (Oct. 6, 2004).

* cited by examiner

METHOD FOR MEASURING INFORMATION ABOUT A SUBSTRATE, AND A SUBSTRATE FOR USE IN A LITHOGRAPHIC APPARATUS

CROSS-REFERENCE TO RELATED APPLICATIONS

This application claims the benefit of priority from U.S. Provisional Patent Application Ser. No. 60/639,847, filed Dec. 29, 2004 and entitled "A METHOD FOR MEASURING INFORMATION ABOUT A SUBSTRATE, AND A SUBSTRATE FOR USE IN A LITHOGRAPHIC APPARATUS," the entire content of which is incorporated herein by reference.

FIELD

The present invention relates to a method for measuring information about a substrate, a substrate for use in a lithographic apparatus, and a combination of a lithographic apparatus and a substrate.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate as used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, than the whole procedure, or a variant thereof, will have to be repeated for each new layer. Eventually, an array of devices will be present on the substrate (wafer). These devices are then separated from one another by a technique such as dicing or sawing, so that the individual devices can be mounted on a carrier, connected to pins, etc.

During the manufacturing process of, for example, an IC, specific process flows are designed to define the device structures. The proper working of the device often depends on the alignment of the individual stacked layers. For this purpose, alignment marks are often exposed in resist at locations where no device structures are present underneath. An alignment sensor may be used for the readout of the alignment marks, after developing, for position determination.

For the purpose of alignment, the alignment marks, or marker structures, may be used which by their interaction with an impinging light beam (or alignment beam) generate one or more diffracted beams. From information collected from the one or more diffracted beams, the position of the marker relative to a position of the pattern on the mask can be determined. Typically, a marker consists of some periodic structure such as a grating, which includes a sequence of lines and trenches.

During the alignment of the marks that are on top of device structures, reflections of the alignment light may occur from the device-specific under-layers. Because the underlying and/or surrounding features change in size and density, which are known to induce different signal responses, even within one die, varying cross-talk often occurs. Such cross-talk may induce a position shift, which may lead to incorrect mark position information after readout by the alignment sensor.

Of course, marks may be used to provide other information, such as focus information, overlay information, exposure dose information, etc. Cross-talk attributable to the underlying and/or surrounding features may also create errors in any information being provided by the mark.

SUMMARY

It is an aspect of the present invention to provide a method for preventing cross-talk between resist marks and the underlying and/or surrounding structures during readout.

In an embodiment, a method for measuring information provided by a substrate is provided. The substrate includes a feature that has been created by a lithographic apparatus. The method includes projecting a beam of light onto a marker disposed above and/or near the feature on the substrate, and detecting information provided by the marker with a sensor. A coating is disposed on the substrate so that the coating lies between the beam of light and the feature to substantially prevent the beam of light from being reflected by the feature and causing an inaccurate readout of the information provided by the marker.

In an embodiment, a substrate for use in a lithographic apparatus is provided. The substrate includes a feature created by the lithographic apparatus, and a marker created in a layer of resist above and/or near the feature. The marker is arranged to provide information about the substrate. The substrate also includes a coating for substantially preventing a beam of light used for detecting the information provided by the marker from being reflected by the feature and causing an inaccurate readout of the information provided by the marker.

In an embodiment, a lithographic apparatus in combination with a substrate for use in the lithographic apparatus is provided. The lithographic apparatus includes an illumination system for conditioning a beam of radiation, and a support for supporting a patterning device. The patterning device serves to impart the beam of radiation with a pattern in its cross-section. The apparatus also includes a substrate table for supporting the substrate, a projection system for projecting the patterned beam of radiation onto a target portion of the substrate, and a sensor for measuring information about the substrate. The substrate includes a feature created by patterning the beam of radiation with the patterning device and projecting the patterned beam of radiation with the projection system onto the target portion of the substrate, and a marker created in a layer of resist above and/or near the feature. The marker is arranged to provide the information about the substrate. The substrate also includes a coating for substantially preventing a beam of light from the sensor in the lithographic apparatus from being reflected by the feature and causing an inaccurate readout of the information provided by the marker.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
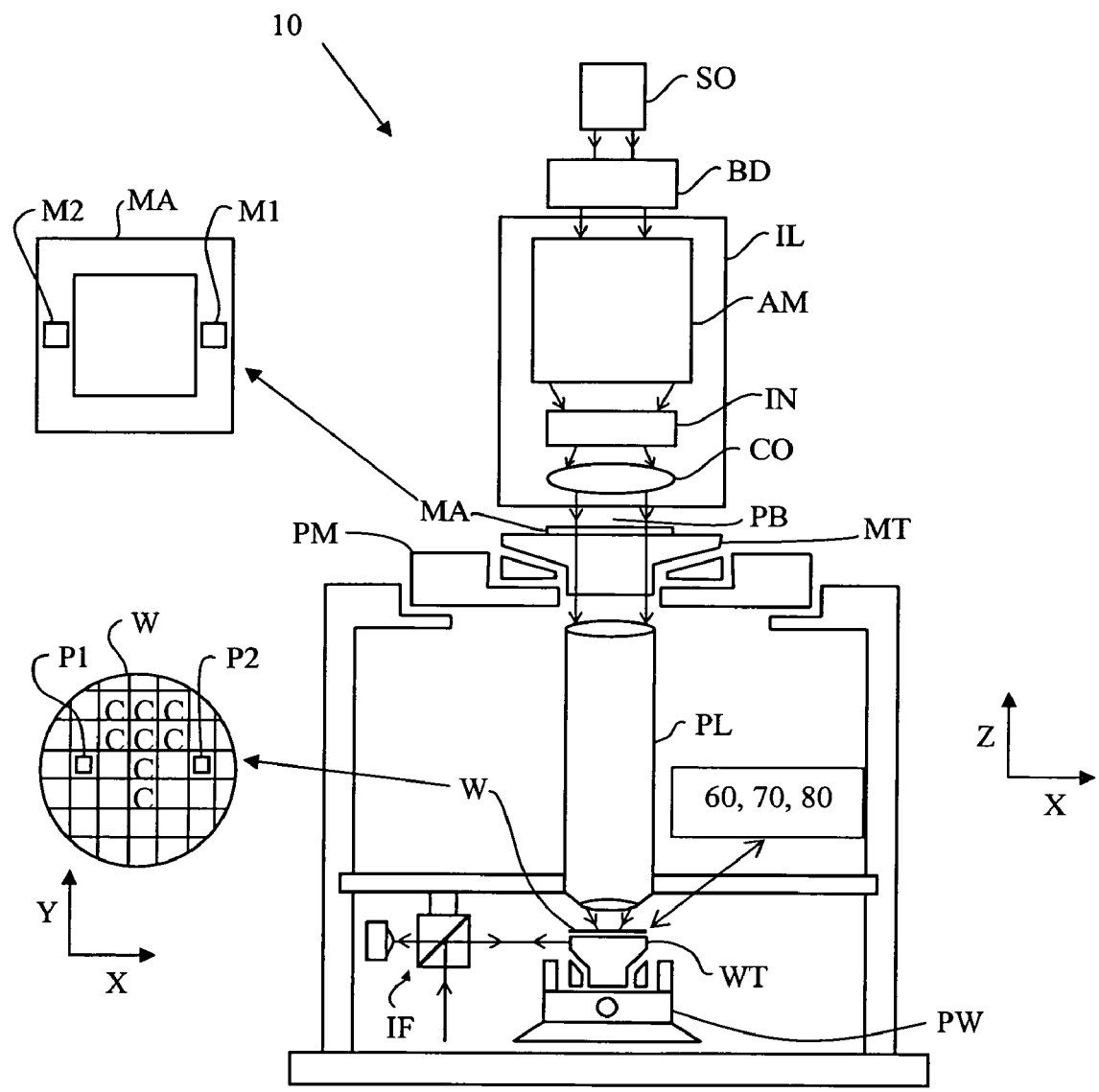
FIG. 1 depicts a lithographic apparatus according to an embodiment of the invention.

FIG. 1 schematically depicts a lithographic apparatus 10 according to a particular embodiment of the invention. The apparatus 10 includes an illumination system (illuminator) IL for providing a projection beam PB of radiation (e.g. UV radiation or EUV radiation), a first support structure (e.g. a mask table) MT for supporting a patterning device (e.g. a mask) MA and connected to a first positioning device PM for accurately positioning the patterning device with respect to item PL, a substrate table (e.g. a wafer table) WT for holding a substrate (e.g. a resist-coated wafer) W and connected to a second positioning device PW for accurately positioning the substrate with respect to item PL, and a projection system (e.g. a refractive projection lens) PL for imaging a pattern imparted to the projection beam PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a reflective mask, like e.g. a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be integral part of the apparatus, for example, when the source is a mercury lamp. The source SO and the illuminator IL, together with the beam delivery system, if required, may be referred to as a radiation system.

The illuminator IL may include an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross-section.

The projection beam PB is incident on the patterning device MA, which is held on the support structure MT. Having traversed the patterning device MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (not shown) can be used to accurately position the patterning device MA with respect to the path of the beam PB, e.g. after mechanical retrieval from a mask library, or during a scan. In general, movement of the support structure MT and the substrate table WT will be realized with the aid of a long-stroke module (coarse positioning) and a short-stroke module (fine positioning), which form part of the positioning devices PM and PW. However, in the case of a stepper (as opposed to a scanner) the support structure MT may be connected to a short stroke actuator only, or may be fixed. The patterning device MA and substrate W may be aligned using patterning device alignment marks M1, M2 and substrate alignment marks P1, P2.

The depicted apparatus may be used in the following example modes:

1. In step mode, the support structure MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Until recently, lithographic apparatus typically contained a single mask table and a single substrate table. However, machines are now available in which there are at least two independently moveable substrate tables; see, for example, the multi-stage apparatus described in U.S. Pat. Nos. 5,969,441, 6,262,796, and 6,710,849. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner, it is possible to increase substantially the machine throughput, which in turn improves the cost of ownership of the machine. It should be understood that the same principle could be used with just one substrate table which is moved between exposure and measurement positions.

The apparatus 10 may also provided with a plurality of sensors 50 that are part of various systems that provide information about the position of the substrate relative to the patterning device and the projection system PL. For example, the apparatus 10 may include an alignment system 60 for aligning the patterning device MA and the substrate W with respect to each other in the XY plane, a focus error detection system 70 for determining a difference between the focal or image plane of the projection system PL and the surface of the substrate W, and a level sensor 80 for mapping the topography of the substrate W.

The alignment system 60 may be of any arrangement, such as an indirect off-axis alignment system described in U.S. Pat. No. 6,297,876, which is incorporated herein by reference and employs an alignment beam of radiation that is radiated by a separate alignment unit and that is incident on a marker, in the form of a grating on the substrate W. As described in further detail below, the grating diffracts the alignment beam into a number of sub-beams extending at different angles to the normal of the grating. The distinct sub-beams will be directed with a lens of the alignment unit to different positions in a plane. In this plane, an element may be provided for further separating the different sub-beams. The lens system will also be used to finally image the different sub-beams on a reference plate to create an image of the mark. In this reference plate, a reference mark may be provided and a radiation sensitive detector (i.e. sensor) may be arranged behind the reference mark. The output signal of the detector will be dependent on the extent to which the image of the substrate mark and the reference mark coincide. In this way, the extent of alignment of the marker on the substrate W with the reference marker in the alignment unit may be measured and optimized. The detector may include separate individual detectors for measuring the intensity and the aligned position at different orders. To finish the alignment, the reference in the alignment unit should be aligned to a second reference marker, for example, one provided to the substrate table with the alignment unit. This second reference marker may then be aligned to a marker in the patterning device MA using exposure light. An apparatus and method as described in U.S. Pat. No. 5,144,363, which is incorporated herein by reference, may be used for that purpose.

Alternatively, a direct on-axis alignment system may be used that directs an alignment beam directly upon a marker provided on the substrate W via the projection system PL. This beam will be diffracted by the marker on the substrate W into different sub-beams and will be reflected into the projection system PL. After traversing the projection system PL, the different sub-beams will be focused on a reference alignment marker provided to the patterning device MA. The image of the substrate marker formed by the sub-beams may be imaged upon the reference marker in the patterning device MA. In this way, the extent of alignment of the marker on the substrate W and the reference marker in the patterning device MA can be measured and optimized. This may be done by using a radiation sensitive detector (i.e. sensor) constructed and arranged to detect the alignment beam traversing the marker in the patterning device MA. For more information with respect to the on-axis alignment system here described see, for example, U.S. Pat. No. 4,778,275, which is incorporated herein by reference.

The apparatus 10 may also include a focus error detection system 70 for determining a deviation between the focal plane of the projection system PL and the surface of the substrate W, so that the deviation may be corrected, for example, by moving the projection system PL along its axis, the Z axis. For an extensive description of an example of a focus error detection system, reference is made to U.S. Pat. No. 4,356,392, which is incorporated herein by reference.

Figure 2:
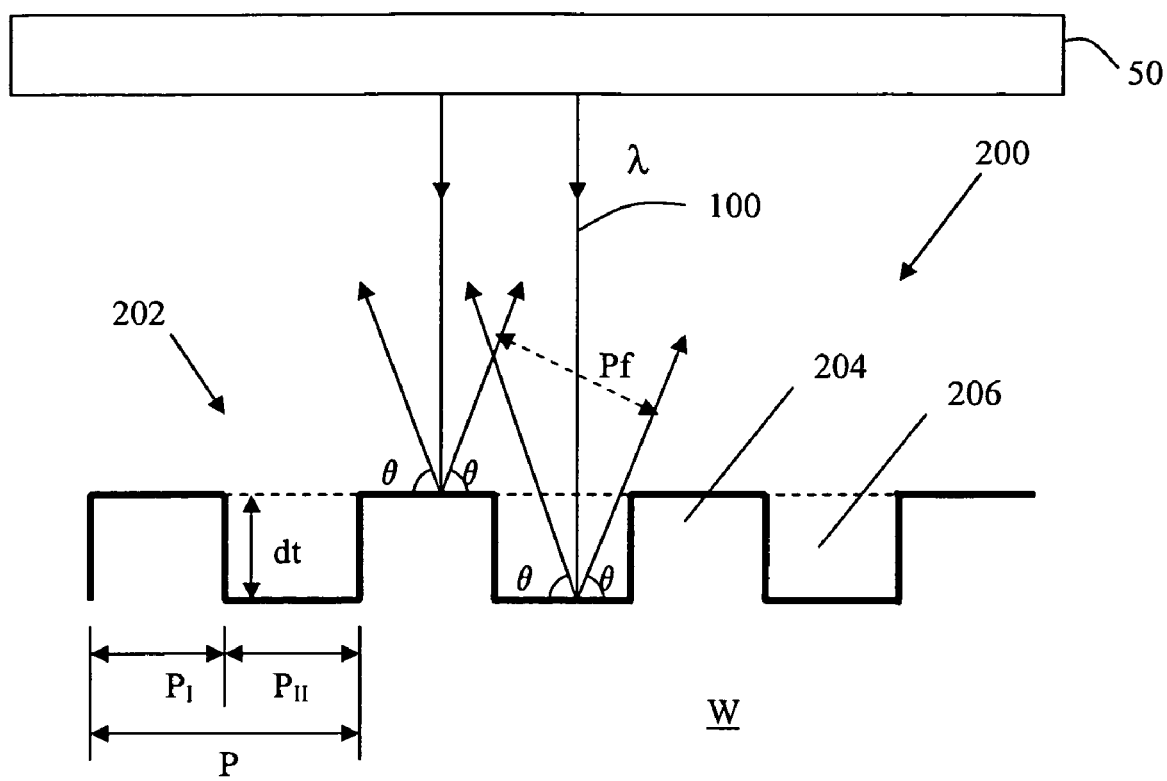
FIG. 2 is a schematic cross-sectional view of marker structure of a substrate used to provide alignment information for the apparatus of FIG. 1.

FIG. 2 depicts an embodiment of an optical marker structure 200 on a substrate. The substrate W may be a semiconductor wafer that is being used in the manufacturing of semiconductor devices. As can be seen in FIG. 2, the marker 200 includes a grating 202 with a periodicity P suitable for diffraction of a beam of impinging light 100 with a wavelength λ well within the visible range of the spectrum. The impinging light 100 is provided by a sensor 50. The sensor 50 may be in the alignment system, the focus error detection system, or the level sensor described above, or may be any other optical sensor that may be constructed and arranged to measure information provided by the marker 200. It will be appreciated that it is not essential that the periodicity P be suitable for diffraction of light within the visible spectrum, and that embodiments of the invention may be implemented with a periodicity P suitable for shorter wavelengths or suitable for longer wavelengths. The term "light" as used herein is not limited to wavelengths within the visible spectrum but may encompass light of longer wavelength or shorter wavelength than visible wavelengths.

The grating 202 consists of a series of lines 204, with interposed trenches 206 in the surface of substrate W. The trenches 206 have a depth $d_t$ with respect to the top surface of the lines 204. The periodicity P of the grating is composed of a line width $P_I$ and a trench width $P_{II}$.

In FIG. 2, the impinging light beam 100 with wavelength λ is directed in a direction substantially perpendicular to the surface of the substrate W. Alternatively, a non-perpendicular inclination of the impinging beam 100, and also a multiplicity of wavelengths may be used as well. In an embodiment, white light, i.e. light with a broadband wavelength, may be used on other, non-diffractive marker patterns.

The marker grating 202 of FIG. 2 is a so-called phase grating. A diffraction pattern is schematically shown by two diffracted beams, each having a diffraction angle θ relative to the surface. In the diffraction pattern, the position of intensity maxima and minima is governed by the periodicity of the grating. When the wavelength λ of the impinging light 100 is within the range of visible light, periodicity P may be 16/n microns (where n is 1, 2, ... 7) to obtain a diffraction pattern suitable for purpose of alignment. In an embodiment, the line width $P_I$ and trench width $P_{II}$ are each 8/n microns ($n \in \{1, 2, \ldots, 7\}$).

In order to obtain sufficient diffracted light from the grating 202 and to obtain an angular distribution (a diffraction pattern) of well-defined diffraction maxima and minima, it may be desirable that the grating 202 encompass a minimal number of lines and intermediate trenches which are illuminated by the impinging light beam. For example, a marker of this type may include at least 10 trenches within the illuminated area. Of course, other types of markers may be used, as would be appreciated by one of ordinary skill in the art.

The intensity of the diffracted beams is further determined by the depth of the trenches 206 relative to a top surface 208 of the lines 204. In a certain direction of diffracted light, the light rays scattered at the top surface 208 of the lines 204 and the light rays scattered at a bottom 210 of the trenches 206 should have a certain phase relation to obtain a positive interference between these light rays in that direction, independent from the periodicity P. The depth of the trenches 206 relative to the top surface 208 of the lines 204 should be such that positive interference will occur, else if the interference is negative, an extinction of the signal will occur. This is known as the phase depth condition.

In the phase grating 202, the interference in the diffraction pattern may be schematically deduced as follows: under angle θ a first set of photons reflect on the top surfaces 208 of the lines 204, while a second set of photons reflect at the floor 210 of the trenches 206. In a given direction θ, an intensity maximum will occur, when the phase difference of light beams scattering from the line top surfaces 208 and from the trench floors 210 is substantially zero at the propagation front PF of the diffracted beam.

Of course, any type of marker structure may be used to provide a reference for measurement. Although the marker 200 illustrated in the figures and described herein may be used for alignment purposes, is not intended to be limiting in any way. For example, to perform a test that maps the focus and/or leveling performance of the apparatus 10 over the substrate W, a special patterning device may be used to shift the image source in an entrance pupil of the projection system PL. This may provide an image at the substrate W level that, at certain locations, will experience a focus dependent lateral shift. For an image that is in best focus, there should be no lateral shift. If an image is not in perfect focus, a lateral shift in both the X and Y directions will be detected by the sensor 50.

In an embodiment, the marker may be arranged to contain other focus information, so that it may be used with the focus error detection system 70 to deduce the focus information, e.g. alignment of the substrate W relative to the projection system PL. The embodiments discussed below apply to any type of marker that may be used in conjunction with the apparatus 10 of FIG. 1, or in any other type of lithographic apparatus described herein.

In an embodiment, the marker may be a box-in-box structure to be used for overlay and/or focus measurements. The box-in-box structure may consist of single lines, or may also consist of gratings. It should be appreciated by one of ordinary skill in the art that the embodiments of the substrate W described below may be applicable to any marker that provides information to any optical sensor used either in the lithographic apparatus 10, or in any offline optical metrology tool (i.e. not specifically in the lithographic apparatus 10, but associated with the apparatus).

Figure 3:
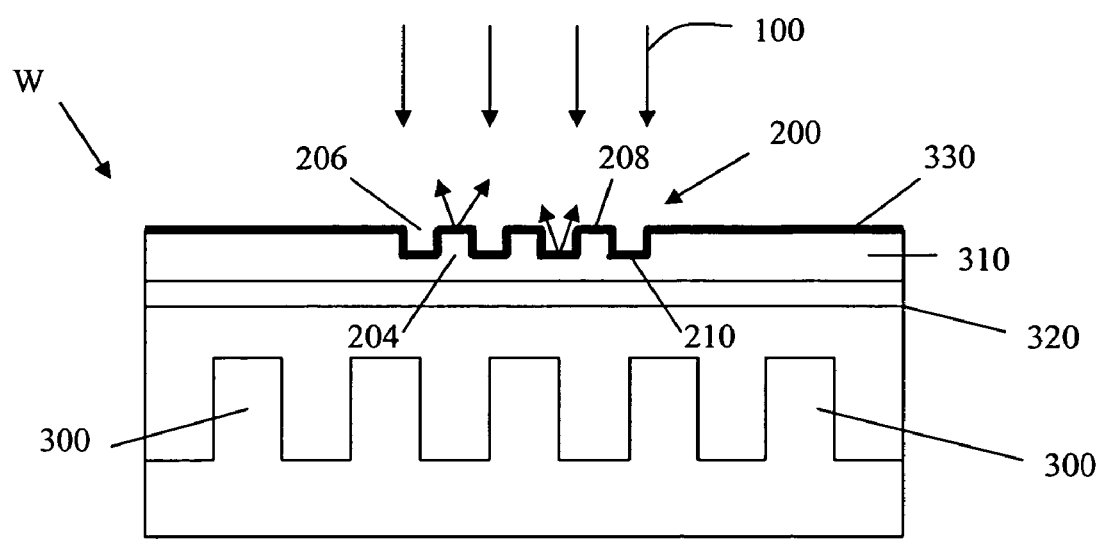
FIG. 3 is a schematic cross-sectional view of one embodiment of a substrate used to provide alignment information for the apparatus of FIG. 1.

FIG. 3 shows a cross section of a substrate W according to an embodiment of the present invention. The substrate W includes at least one feature 300 that has been created by a lithographic method using the lithographic apparatus of FIG. 1. That is, the patterned beam of radiation was projected onto a target portion of the substrate with the projection system PL to create the feature 300, as would be understood by one of ordinary skill in the art.

Also shown in FIG. 3 is a resist 310 that has been deposited over the at least one feature 300. The resist 310 may include a bottom anti-reflective coating 320, commonly referred to as a "BARC," that is disposed in between the resist 310 and the at least one feature 300. The marker 200 is imaged onto the resist 310 directly over the feature 300 by patterning a beam of radiation with a patterning device that includes an alignment marker. After the marker 200 has been developed, the resist 310 is coated with an opaque coating 330 in such a way that the coating 330 is substantially uniform over the marker 200. In other words, the trenches 206 of the marker 200 are not completely filled in; instead, the bottom surface 210 of the trenches 206 have a coating 330 of substantially the same thickness as the top surface 208 of the lines 204. This way, the profile of the marker 200 is not been substantially changed with the presence of the opaque coating 330.

In an embodiment, the resist 310 may be provided and the marker 200 may be imaged so that the marker 200 is near, i.e. beside, the feature 300. It is to be understood that "near" in this context means that the marker 200 is close enough to the feature 300 that the feature 300 may reflect the beam of light 100 emitted from the sensor 50, thereby contributing to possible error in the measurement of the information being provided by the marker 200.

The opaque coating 330 substantially prevents the beam of light 100 emitted from the sensor 50 from being reflected by the underlying feature 300 and causing an inaccurate alignment of the substrate W relative to the patterning device MA. Thus, by providing a coating between the beam of light 100 of the sensor 50 and the feature 300, the marker 200 may be imaged directly over a feature, rather than being isolated to a portion of the substrate that contains no features. This ability allows a product substrate to be qualified using more accurate results. It also allows the product to be used for defocus mapping, which may be used to further qualify the product, as well as for obtaining overlay (X,Y) information, and for exposure dose information, as would be appreciated by one of ordinary skill in the art.

In an embodiment, the opaque coating 330 comprises a metal, such as aluminum, and may be coated onto the resist 310 with a thickness of greater than about 20 nm. Preferably, the thickness of the opaque coating 330 is greater than about 40 nm. Of course, coatings containing other metals and materials may be used, and the thickness of the coating may be altered for optimum results. These examples are not intended to be limiting in any way.

In an embodiment, the opaque coating 330 may be created by first growing a seed layer that may allow for optimal crystal growth of an opaque metal. For example, the seed layer may be tantalum, and/or the opaque metal may be aluminum. This may allow the grain sizes to be smaller, thereby reducing possible disturbance of the grains on the readout of the information provided by the marker 200. It should be appreciated that such an example is not intended to be limiting in any way. Different materials may be used in the seed layer, and different metals may be used as the opaque metal.

After the alignment and/or focus measurements have been taken, the coating 330 may be removed so that the substrate W may be processed further. In other words, the embodiments provided by the present invention may provide a non-destructive way to test the substrate W, as would be appreciated by one of ordinary skill in the art. Inclusion of the BARC 320 may assist in protecting the feature 300 below while the coating 330 is removed.

Figure 4:
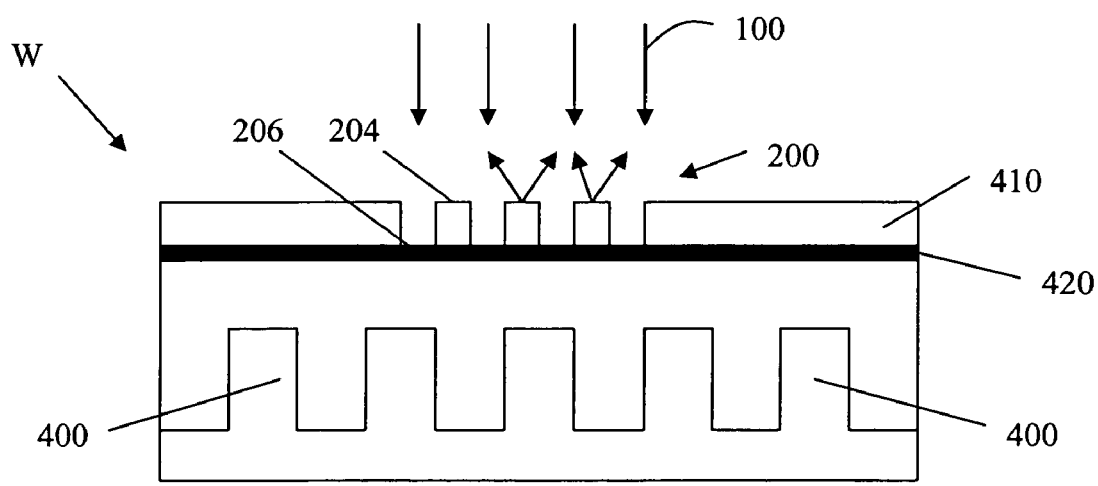
FIG. 4 is a schematic cross-sectional view of another embodiment of a substrate used to provide alignment information for the apparatus of FIG. 1.

In another embodiment, shown in FIG. 4, the substrate W includes a feature 400 that has been created by the lithography process described above. In this embodiment, a coating 420 is disposed between the beam of light 100 from the sensor 50 and the feature 400 is provided below the resist 410. Such a coating 420 is preferably an anti-reflective coating ("ARC") that provides anti-reflective properties for the operative exposure radiation of the lithographic apparatus and for the beam of light provided by an alignment sensor, but is also preferably transparent for the wavelength of radiation used by a level sensor that is used to map the topography of the substrate W. For example, the operative exposure radiation may have a wavelength of 248 nm, the wavelength of the beam of light provided by the alignment sensor may be 533 nm and/or 632.8 nm, and the level sensor may use a beam of light with a wavelength of about 900 nm-1100 nm. Thus, the ARC should be anti-reflective (i.e. absorbing) at wavelengths that include 248 nm, 533 nm, and 632.8 nm, but be transparent at wavelengths between about 900 nm-1100 nm. In an embodiment, the ARC is non-photosensitive. ARC's that have been used in lithography are often photosensitive, and refractive index matching is used to ensure that the ARC is effective for each layer and feature of the substrate. By providing an ARC that is non-photosensitive, the ARC may be used for substantially all layers and features.

Figure 5:
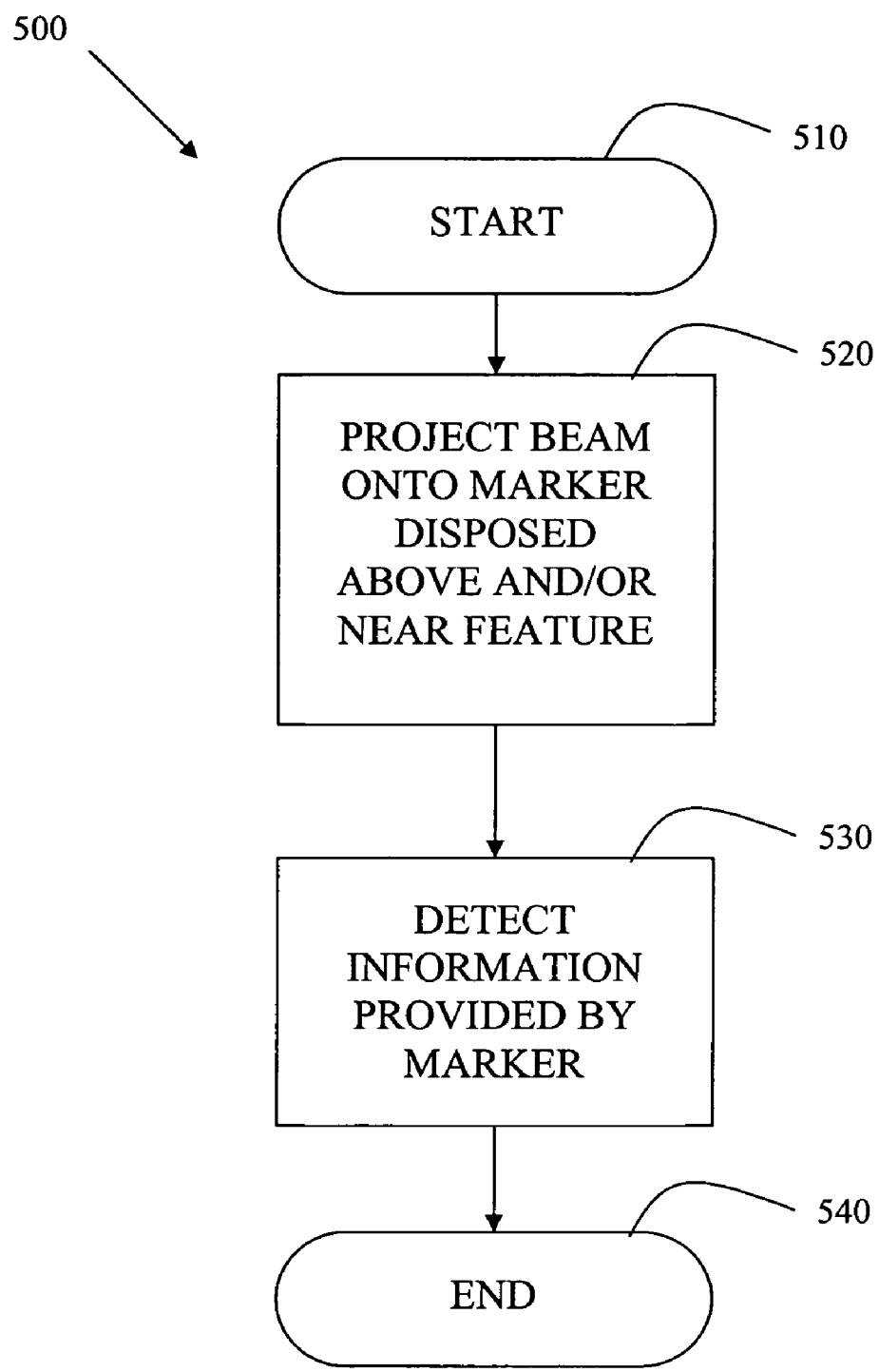
FIG. 5 depicts an embodiment of a method for measuring information about a substrate that includes a feature that has been created by the lithographic apparatus of FIG. 1.

FIG. 5 depicts an embodiment of a method 500 for measuring information provided by the substrate W. The substrate W includes a feature 300, 400 that has been created by the lithographic apparatus 10 depicted in FIG. 1. The method 500 starts at 510. At 520, a beam of light 100 is projected onto the marker 200 disposed above and/or near the feature 300, 400 on the substrate W. Information provided by the marker 200 is detected by the sensor 50 at 520. The information may be alignment information, focus information, overlay information, exposure dose information, or any other type of information that may be provided by a marker in conjunction with a sensor. Prior to the light being projected onto the marker 200, the coating 330, 420 is disposed on the substrate W so that the coating 330, 420 lies between the beam of light 100 and the feature 300, 400 to substantially prevent the beam of light 100 from being reflected by the feature 300, 400 and causing an inaccurate readout of the information being provided by the marker 200. The method ends at 530.

In an embodiment, depending on the type of information being provided by the marker 200, a position of the substrate W may be adjusted on the basis of the detecting. For example, if the information being provided is alignment information of the substrate W relative to the patterning device MA in the X-Y plane, the position of the substrate W may be adjusted in the X-Y plane. Also, if the information being provided is focus or alignment information of the substrate relative to the projection system PL along the Z-axis, then the position of the substrate W may be adjusted relative to the projection system PL along the Z-axis.

It will be apparent to the person skilled in the art that other embodiments of the invention may be conceived and reduced to practice without departing from the spirit of the invention. Methods as described herein may also be implemented as software, firmware, hardware, or some combination of these (e.g. in the form of one or more sets of machine-executable instructions stored on a data storage medium such as a disk or computer memory). In an embodiment, there is provided a computer program comprising program code that, when executed on a computer system, instructs the computer system to perform one or more methods as described herein.

While preferred embodiments of the invention have been shown and described, they are not intended to be limiting in any respect. To the contrary, the invention is intended to encompass all variations and modifications within the spirit and scope of the appended claims.

What is claimed is:

1. A method for measuring information provided by a substrate, the substrate comprising a feature that has been created by a lithographic apparatus, the method comprising:
    projecting a beam of light onto a marker disposed above and/or near the feature on the substrate; and
    detecting information provided by said marker with a sensor;
    wherein a coating is disposed on the substrate so that the coating lies between the beam of light and the feature to substantially prevent the beam of light from being reflected by the feature and causing an inaccurate readout of the information provided by the marker, and wherein the coating comprises an opaque layer of material that is deposited on top of the marker.

2. A method according to claim 1, wherein the opaque layer comprises a metal.

3. A method according to claim 2, wherein the metal comprises aluminum.

4. A method according to claim 1, wherein the coating comprises a seed layer for growing crystals of an opaque metal.

5. A method according to claim 4, wherein the seed layer comprises tantalum and the metal comprises aluminum.

6. A method according to claim 1, further comprising an anti-reflective coating disposed between the marker and the feature.

7. A method according to claim 6, wherein the anti-reflective coating is non-photosensitive.

8. A method according to claim 6, wherein the anti-reflective coating is anti-reflective to the wavelength of the beam of light.

9. A method according to claim 8, wherein the wavelength of the beam of light is about 533 nm.

10. A method according to claim 8, wherein the wavelength of the beam of light is about 632.8 nm.

11. A method according to claim 1, wherein the sensor is an alignment sensor.

12. A method according to claim 1, wherein the sensor is a focus sensor.

13. A method according to claim 1, wherein the sensor is an optical sensor.

14. A method according to claim 1, wherein the information provided by said marker comprises the position of said marker in an X-Y plane.

15. A method according to claim 14, wherein the position comprises an aligned position of the substrate relative to a patterning device in the lithographic apparatus.

16. A method according to claim 15, further comprising adjusting a position of the substrate on the basis of said detecting.

17. A method according to claim 1, wherein the information provided by said marker comprises focus information.

18. A method according to claim 17, wherein the focus information is used in a test that maps focus and/or leveling performance over the substrate.

19. A method according to claim 1, wherein the information provided by said marker comprises exposure dose information.

20. A method according to claim 1, wherein said detecting comprises detecting light diffracted by said marker with said sensor.

21. A method according to claim 1, wherein the method is carried out in the lithographic apparatus.

22. A method according to claim 1, wherein the method is carried out in a metrology tool.

23. A substrate for use in a lithographic apparatus, the substrate comprising:
    a feature created by the lithographic apparatus;
    a marker created in a layer of resist above and/or near the feature, the marker being arranged to provide information about the substrate; and
    a coating for substantially preventing a beam of light used for detecting the information provided by the marker from being reflected by the feature and causing an inaccurate readout of the information provided by the marker, wherein the coating comprises an opaque layer deposited over the marker.

24. A substrate according to claim 23, wherein the opaque layer comprises a metal.

25. A substrate according to claim 24, wherein the metal comprises aluminum.

26. A substrate according to claim 23, wherein the coating comprises a seed layer for growing crystals of an opaque metal.

27. A substrate according to claim 26, wherein the seed layer comprises tantalum and/or the metal comprises aluminum.

28. A substrate according to claim 23, further comprising an anti-reflective coating disposed in between the feature and the marker.

29. A substrate according to claim 28, wherein the anti-reflective coating is non-photosensitive.

30. A substrate according to claim 28, wherein the anti-reflective coating is anti-reflective to the wavelength of the beam of light.

31. A substrate according to claim 30, wherein the wavelength of the beam of light is about 533 nm.

32. A substrate according to claim 30, wherein the wavelength of the beam of light is about 632.8 nm.

33. A substrate according to claim 23, wherein the information provided by said marker comprises the position of said marker in an X-Y plane.

34. A substrate according to claim 33, wherein said position of said marker provides information about an aligned position of the substrate relative to a patterning device in the lithographic apparatus.

35. A substrate according to claim 23, wherein the information provided by said marker comprises focus information.

36. A substrate according to claim 35, wherein the focus information is used in a test that maps focus and/or leveling performance over the substrate.

37. A substrate according to claim 23, wherein the information provided by said marker comprises exposure dose information.

38. A substrate according to claim 23, wherein the marker comprises a plurality of lines and a plurality of trenches, the plurality of line and trenches being arranged in a repetitive order in the marker.

39. A substrate according to claim 23, wherein the marker consists of an arrangement of single lines.

40. A substrate according to claim 23, wherein the beam of light is provided in the lithographic apparatus.

41. A substrate according to claim 23, wherein the beam of light is provided in a metrology tool.

42. A lithographic apparatus in combination with a substrate for use in the lithographic apparatus, the lithographic apparatus comprising:
   an illumination system for conditioning a beam of radiation;
   a support for supporting a patterning device, the patterning device serving to impart the beam of radiation with a pattern in its cross-section;
   a substrate table for supporting the substrate;
   a projection system for projecting the patterned beam of radiation onto a target portion of the substrate; and
   a sensor for measuring information about the substrate; and the substrate comprising:
   a feature created by patterning the beam of radiation with the patterning device and projecting the patterned beam of radiation with the projection system onto the target portion of the substrate;
   a marker created in a layer of resist above and/or near the feature, the marker being arranged to provide the information about the substrate; and
   a coating for substantially preventing a beam of light from the sensor in the lithographic apparatus from being reflected by the feature and causing an inaccurate readout of the information provided by the marker, wherein the coating comprises an opaque layer deposited over the marker.

43. A combination according to claim 42, wherein the opaque layer comprises a metal.

44. A combination according to claim 43, wherein the metal comprises aluminum.

45. A combination according to claim 42, wherein the coating comprises a seed layer for growing crystals of an opaque metal.

46. A combination according to claim 45, wherein the seed layer comprises tantalum and/or the metal comprises aluminum.

47. A combination according to claim 42, further comprising an anti-reflective coating disposed in between the feature and the marker.

48. A combination according to claim 47, wherein the anti-reflective coating is non-photosensitive.

49. A combination according to claim 47, wherein the anti-reflective coating is anti-reflective to the wavelength of the beam of light provided by the sensor.

50. A combination according to claim 49, wherein the wavelength of the beam of light is about 533 nm.

51. A combination according to claim 49, wherein the wavelength of the beam of light is about 632.8 nm.

52. A combination according to claim 42, wherein the lithographic apparatus further comprises a level sensor for mapping the topography of the substrate.

53. A combination according to claim 52, wherein the coating is transparent to the wavelength of a beam of light provided by the level sensor.

54. A combination according to claim 53, wherein the wavelength is between about 900 nm and about 1100 nm.

55. A combination according to claim 42, wherein the sensor is an alignment sensor.

56. A combination according to claim 42, wherein the sensor is a focus sensor.

57. A combination according to claim 42, wherein the sensor is an optical sensor.

58. A combination according to claim 42, wherein the information provided by said marker comprises the position of said marker in an X-Y plane.

59. A combination according to claim 58, wherein said position of said marker provides information about an aligned position of the substrate relative to the patterning device in the lithographic apparatus.

60. A combination according to claim 42, wherein the information provided by said marker comprises focus information.

61. A combination according to claim 60 wherein the focus information is used in a test that maps focus and/or leveling performance over the substrate.

62. A combination according to claim 42, wherein the information provided by said marker comprises dose information.

63. A combination according to claim 42, wherein the marker comprises a plurality of lines and a plurality of trenches, the plurality of line and trenches being arranged in a repetitive order in the marker.

64. A combination according to claim 42, wherein the marker consists of an arrangement of single lines.

* * * * *